United States Patent

[11] 3,600,603

[72] Inventors Teruji Watanabe Kitaadachi-gun; Hideo Yamamoto, Sagamihara-shi, both of, Japan
[21] Appl. No. 3,080
[22] Filed Jan. 15, 1970
[45] Patented Aug. 17, 1971
[73] Assignee Kokusai Denshin Denwa Kabushiki Kaisha Tokyo-to, Japan
[32] Priority Jan. 20, 1969
[33] Japan
[31] 44/3517

[54] TERNARY LOGIC CIRCUIT
3 Claims, 5 Drawing Figs.

[52] U.S. Cl. .......... 307/206, 307/209, 307/255, 307/258
[51] Int. Cl. .......... H03k 19/10, H03k 19/08
[50] Field of Search .......... 307/209, 258, 206, 255

[56] References Cited

UNITED STATES PATENTS

| | | | |
|---|---|---|---|
| 3,027,464 | 3/1962 | Kosonocky | 307/209 |
| 3,492,496 | 1/1970 | Callan | 307/209 |

*Primary Examiner*—Donald D. Forrer
*Assistant Examiner*—B. P. Davis
*Attorneys*—Robert E. Burns and Emmanuel J. Lobato

ABSTRACT: A ternary logic circuit, in which values of series-connected two controllable resistances to which plus potential and minus potential are respectively applied are controlled by a common input voltage. The output of the ternary logic circuit assuming one of three possible values in accordance with the value of the input voltage is obtained across a nonlinear load resistance connected across the ground and a junction between the two controllable resistances.

TERNARY LOGIC CIRCUIT

This invention relates to ternary logic circuits.

A ternary logic system using ternary logic circuits has such advantage that the number of necessary logic circuits can be reduced in comparison with a binary logic system using binary logic circuits in designing a logic system, such as a computer. However, since ternary logic circuits suitable to readily reduce to practice have not yet been proposed, this ternary logic system has not yet been reduced to practice.

An object of this invention is to provide ternary logic circuits of simple construction suitable to be readily reduced to practice.

The principle, construction and operation of the ternary logic circuit of this invention will be better understood from the following detailed discussion in conjunction with the accompanying drawings, in which.

Figure 1:
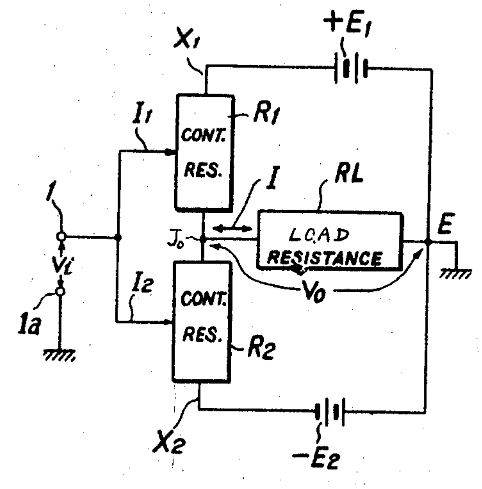
FIG. 1 is a block diagram for describing the principle of this invention.
Figure 2:
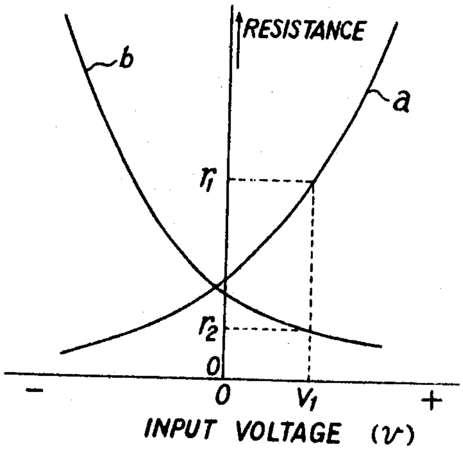
FIG. 2 shows characteristic curves explanatory of the characteristics of controllable resistances used in the circuit shown in FIG. 1.
Figure 3:
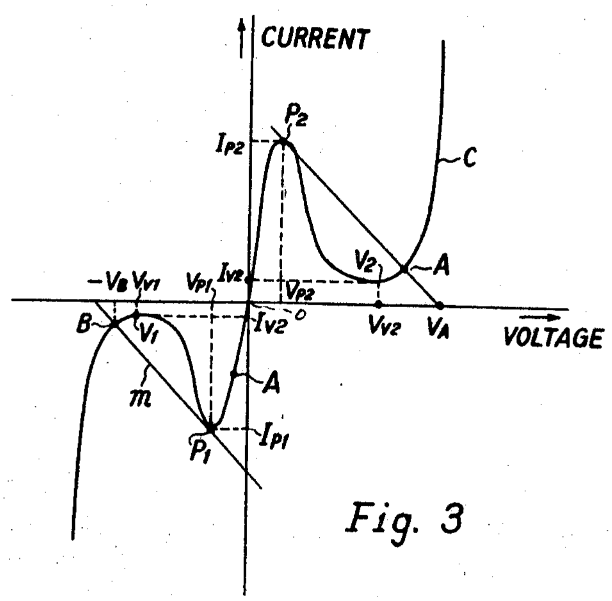
FIG. 3 shows a characteristic curve explanatory of the characteristic of a nonlinear load resistance used in the circuit shown in FIG. 1.

With reference to FIG. 1, a ternary logic circuit of this invention comprises a first controllable resistance $R_1$, a second controllable resistance $R_2$ connected in series to the first controllable resistance $R_1$, a DC source $+E_1$ applying a plus DC voltage to the first controllable resistance $R_1$, a DC source $-E_2$ applying a minus DC voltage to the second controllable resistance $R_2$, and a load resistance RL connected across the ground E and a junction $J_o$ between the first controllable resistance $R_1$ and the second controllable resistance $R_2$. An input voltage $V_i$ supplied across terminals 1 and 1*a* is commonly applied to respective input terminals $I_1$ and $I_2$ of the first and second controllable resistances $R_1$ and $R_2$. In this case, the value of one of the first and second controllable resistances $R_1$ and $R_2$ increases continuously as the value of the input voltage $V_i$ increases as shown by a curve *a* in FIG. 2. On the other hand, the value of the other of the first and second controllable resistances $R_1$ and $R_2$ decreases continuously as shown by a curve *b* in FIG. 2. Moreover, the load resistance RL has a double N-shaped nonlinear voltage-current characteristic as shown in FIG. 3 in which the load resistance RL has a N-shaped voltage-current characteristic in each of plus and minus current regions. In other words, the terminal voltage $V_o$ of the load resistance RL assumes a low value until the current I of the load resistance RL exceeds a plus threshold level $I_{p2}$ or a minus threshold level $I_{p1}$ after starting from zero and assumes one of two possible values when the current I of the load resistance means RL exceeds the plus and minus threshold levels $I_{p1}$ and $I_{p2}$. The two possible values are substantially constant plus and minus values each higher than the low value. In this case, the plus constant value is obtained when the current I exceeds the plus threshold level $I_{p2}$, and the minus constant value is obtained when the current I exceeds the minus threshold level $I_{p1}$.

To obtained a preferred input-output characteristic described below, it is desirable that each of two peak voltages $V_{p1}$ and $V_{p2}$ in a voltage-current curve *c* is small as far as possible. Moreover, it is desirable that the slope of the curve *c* is sharp as far as possible when the terminal voltage $V_o$ of the load resistance RL exceeds either a minimum voltage $V_{v2}$ or $V_{v1}$. In the following description, it is assumed that these conditions are satisfied for simple description.

In operation, the voltages of the DC sources $+E_1$ and $-E_2$ are so adjusted that the current I flowing through the load resistance RL is zero when the input voltage $V_i$ is zero. Accordingly, the potential of the junction $J_o$ is also zero in this case. In this condition, the input voltage $V_i$ of positive pulse is applied across terminals 1 and 1*a* as shown in FIG. 2. In accordance with this application of the input voltage $V_i$, the value of the first controllable resistance $R_1$ increases along the curve *a* and reaches a value $r_1$ while the value of the second controllable resistance $R_2$ decreases along the curve *b* and reaches a value $r_2$. Accordingly, since the potential of the junction $J_o$ is shifted to a minus value from zero, the current I flows from the ground E to the junction $J_o$. In this case, the output voltage $V_o$ generated across the load resistance RL is determined in accordance with the characteristic shown in FIG. 3. When the input voltage $V_i$ increases to the plus side from zero, the current I increases to the minus side. Since the operating point of the load resistance RL exists between points O and $p_1$ on the curve *c* until the current I exceeds a value $I_{p1}$, the output voltage $V_o$ increases gradually up to a value $V_{pl}$. However, the value of the output voltage $V_o$ is very low in this condition. When the current I exceeds the value $I_{p1}$ in accordance with increase of the input voltage $V_i$, the operating point of the load resistance means RL jumps over a negative resistance region (from the point $P_1$ to a point $V_1$) to a point B along a load line *m* of the load resistance means RL. In this case, the slope of the load line *m* can be approximately deemed as the value of the load resistance RL. Accordingly, the value of the output voltage $V_o$ increases suddenly from the value $V_{p1}$ to a value $-V_B$. In a case where the input voltage $V_i$ further increases to the minus side, since the curve *c* has a sharp slope at the outside of the point B, the output voltage $V_o$ is substantially constant while the increase of the output voltage $V_o$ is negligible.

Figure 4:
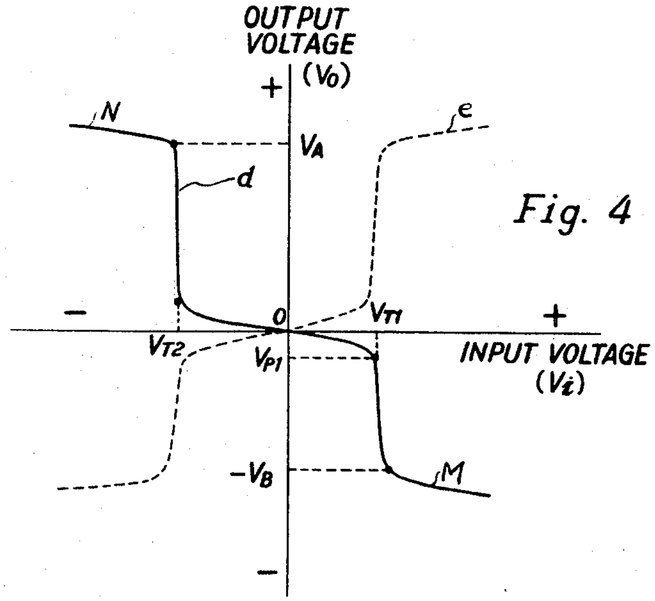
FIG. 4 shows input-output characteristics of the circuit shown in FIG. 1.

The above-mentioned operation is a section O-M of an input-output characteristic shown in FIG. 4 in which the abscissa is the value of the input voltage $V_i$ and the ordinate is the value of the output voltage $V_o$. In this case, a value $V_{T1}$ is the value of the input voltage $V_i$ when the current I is equal to the value $I_{p1}$. As understood from this characteristic, (1) the output voltage $V_o$ assumes a very low value substantially equal to zero if the input voltage $V_i$ falls in a first region from zero to the voltage $V_{T1}$; (2) the output voltage $V_o$ jumps to the value $-V_B$ at a condition where the input voltage $V_i$ is equal to the voltage $V_{T1}$; and (3) the output voltage $V_o$ is substantially zero while it increases by insensible transitions if the input voltage $V_i$ increases in a second region exceeding the voltage $V_{T1}$. On the other hand, if the input voltage $V_i$ decreases from the second region ($Vi>V_{T1}$) to zero along the curve *c*, the jump over the negative resistance region is started at the point $V_1$ shown in FIG. 3. This jumping is started in FIG. 4 at a value slightly shifted to zero from the value $V_{T1}$. This hysteresis characteristic is substantially negligible in comparison with the value $V_{T1}$ if the resistances of the controllable resistances $R_1$ and $R_2$ are small as far as possible under nonoscillation of this circuit. Accordingly, a curve *d* shown in FIG. 4 can be substantially deemed as a single curve.

The above operations relate to a case where the input voltage $V_i$ is plus. However, if references $P_1$, $V_1$, $I_{p1}$, B and $-V_B$ etc. shown in FIG. 3 are respectively replaced by references $P_2$, $V_2$, $I_{p2}$, A and $V_A$ etc. in the same FIG. 3, a section O–N of the input-output characteristic corresponding to a case where the input voltage $V_i$ has a minus polarity can be obtained as shown in FIG. 4. In this case, the value $V_{T2}$ is the value of the input voltage $V_i$ in a case where the current I is equal to the value $I_{p2}$, and a value $V_A$ shown in FIGS. 3 and 4 can be deemed as the value of the output voltage $V_o$ in a region where the input voltage $V_i$ exceeds the value $V_{T2}$.

Accordingly, the value of the output voltage $V_o$ of the circuit assumes (1) substantially zero in a case where $V_{T2}<V_i<V_{T1}$; (2) substantially the value $-V_B$ in a case where $V_i>V_{T1}$; and (3) substantially the value $V_A$ in a case $V_i<V_{T2}$. The values $V_{T1}$, $V_{T2}$, $-V_B$ and $V_A$ characterizing the characteristic of this circuit shown in FIG. 1 are determined by the threshold currents $I_{p1}$ and $I_{p2}$ and the minimum voltages $V_{v1}$ and $V_{v2}$.

As described below, the nonlinear load resistance means RL can be realized by the use of a series-connection of Esaki-diodes (tunnel diodes) so as to have the characteristic shown in FIG. 3. In this case, the values $I_{p1}$ and $I_{p2}$ can be determined as desired; and values $V_{v1}$ and $V_{v2}$ can be varied by changing the material of the Esaki diodes or can be varied in a terraced manner by changing the number of series-connected Esaki diodes. As understood from above, the characteristic values $V_{T1}$, $V_{T2}$, $-V_B$ and $V_A$ can be varied in respective wide ranges. In this case, since the jumping speed at the values $V_{T1}$ and $V_{T2}$ are very high, the circuit of this invention performs a high speed ternary pulse-reshaping operation.

Moreover, ratios $V_A/V_{T1}$ and $-V_B/V_{T2}$ which are deemed as the amplification constant of this circuit are determined by the sensitivity of the controllable resistances $R_1$ and $R_2$ (i.e.; the slope R/V of the curves *a* and *b* shown in FIG. 2). In other words, the amplification constant of this circuit becomes higher as the slope of the curves *a* and *b* becomes sharper. In an embodiment described below, transistors are used as the controllable resistances $R_1$ and $R_2$. In this case, the amplification constant of this circuit becomes higher as the current amplification factor $h_{FE}$ becomes larger.

In the above description, it is assumed that the respective characteristics of the first controllable resistance $R_1$ and the second controllable resistance $R_2$ are shown respectively as the curves *a* and *b* in FIG. 2. However, the respective characteristics of the resistances $R_1$ and $R_2$ may be respectively the curves *b* and *a*. In this case, the input-output characteristic of this circuit is shown as a dotted curve *e* shown in FIG. 4, in which the polarity of the output voltage $V_o$ is inversed against the curve *d*.

The circuit of this invention is a ternary pulse reshaping-amplifying circuit having the above mentioned function. Moreover, this circuit of this invention can be applied to perform ternary logical NOT $f_n$, ternary logical OR $f_{or}$, ternary logical AND $f_{and}$ ternary logical NOR $f_{nor}$ and ternary logical NAND $f_{nand}$ proposed by Post-Lukasiewicz. Conditions in this case will be described below.

Now, it is assumed that ternary digits are "1," "Φ" and "0" and the relationship "1">"Φ">"0" is to be decided. In this case, if it is assumed that N logical variables each assuming one of three possible values "1," "Φ" and "0" are respectively designated by notations $x_1, x_2, ..... x_N$, the above-mentioned ternary logical NOT $f_n$ ternary logical OR $f_{or}$, ternary logical AND $f_{and}$, ternary logical NOR $f_{nor}$ and ternary logical NAND $f_{nand}$ are defined respectively as follows:

$f_n$:$f_n(1)=0$;$f_n(\Phi)=\Phi$;$f_n(0)=1$ $f_{or}$:$f_{or}(x_1,x_2, ..., x_N)=\max.(x_1, ..., x_N)$ fand:$f_{and}(x_1,x_2, ..., x_N)=\min.(x_1, x_2, ..., x_N)$ $f_{nor}$:$f_{nor}(x_1, x_2, ..., x_N)=f_n(f_{or}(x_1, ..., x_N))$

*f*nand:$f(x_1, x_2, ..., x_N)=f_n(f_{and}(x_1, x_2, ..., x_N))$

In the circuit shown in FIG. 1, the ternary logical digits "1," "Φ" and "0" correspond respectively to the values $V_A$, O, $-V_B$. In this condition, the input voltage $V_i$ is one of the above mentioned logical variables $x_1, x_2, ..., x_N$.

In this case, if it is assumed that the value $V_A$ is more than the value $V_{T1}$ and the value $-V_B$ is less than the value $V_{T2}$ in the characteristic shown in FIG. 4, the ternary logical NOT $f_n$ corresponds to the curve *d*. In the case of the curve *e*, the circuit of this invention can be used as a simple reshaping-amplifying circuit for a ternary pulse signal in accordance with an equivalent function.

If it is assumed that the sum of N different variables corresponds to the input voltage $V_i$, the curve *d* corresponds to the ternary logical NOR $f_{nor}$ and the curve *e* corresponds to the ternary logical OR $f_{or}$ in a case where (1) the value $V_A$ is more than a value $(N-1)\ V_B$, (2) a value $(V_A-(N-1)\ V_B)$ is more than the value $V_{T1}$, and (3) the value $V_{T2}$ is less than a value $-(N-1)V_B$ and more than a value $-NV_B$. On the other hand, in a case where (1) the value $V_B$ is more than a value $(N-1)\ V_A$, (2) the value $V_{T1}$ is less than a value $NV_A$ and less than a value $(N-1)V_A$, and (3) the value $V_{T2}$ is less than a value $((N-1)V_A-V_B)$, the curves *d* and *e* correspond respectively to the ternary logical NAND $f_{nand}$ and the ternary logical AND $f_{and}$.

Figure 5:
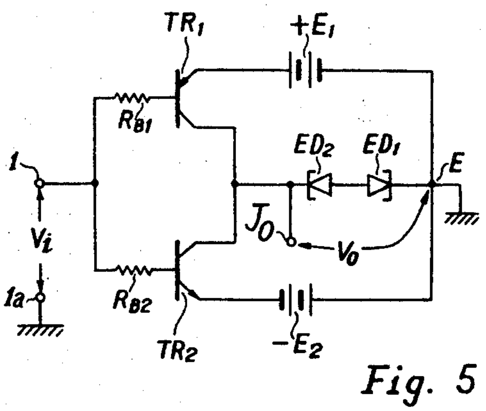
FIG. 5 is a circuit diagram for illustrating an embodiment of this invention.

With reference to FIG. 5, an embodiment of this invention comprises a PNP transistor $TR_1$ used as the first controllable resistance, a NPN transistor $TR_2$ used as the second controllable resistance, and a series-connection of two sets of Esaki diodes $ED_1$ and $ED_2$ which are oppositely series-conected to each other and used as the load resistance RL. In this case, each of the sets of Esaki diodes $ED_1$ and $ED_2$ comprises a plurality of Esaki diodes which are series-connected to one another in the same direction. The respective emitter-collector paths of the transistors $TR_1$ and $TR_2$ are series-connected to each other. The series-connection of the two sets of Esaki diodes $ED_1$ and $ED_2$ is connected across the ground E and a junction $J_o$ between collectors of the transistors $TR_1$ and $TR_2$. A DC source $+E_1$ applies a plus voltage to the emitter of the transistor $TR_1$, and a DC source $-E_2$ applies a minus voltage to the emitter of the transistor $TR_2$. An input voltage $V_i$ is applied through respective resistors $R_{B1}$ and $R_{B2}$ to bases of the transistors $TR_1$ and $TR_2$ respectively. The output voltage $V_o$ is obtained across the series-connection of Esaki diodes $ED_1$ and $ED_2$.

In this embodiment, the respective resistances of the emitter-collector paths of the transistors $TR_1$ and $TR_2$ are controlled by the input voltage $V_i$ and varied as shown by the curves *a* and *b* in FIG. 2. The voltage-current characteristic of the load resistance comprising the series-connection of the two sets of Esaki diodes $ED_1$ and $ED_2$ varies along the curve *c* shown in FIG. 3. In this case, a right half of the curve *c* divided by the ordinate corresponds to the forward characteristic of the set of Esaki diodes $ED_1$, and a left half of the curve *c* corresponds to the forward characteristic of the set of Esaki diodes $ED_2$. Accordingly, all operations described with reference to FIGS. 1, 2 and 3 can be applied without modification to this embodiment shown in FIG. 5, and the input-output characteristic of this embodiment can be designated similarly by the curve *d* shown in FIG. 4. As previously described, values $V_{T1}$, $V_{T2}$, $-V_B$ and $V_A$ can be varied in respective wide ranges in this embodiment. Moreover, since jumping operation caused at each of the values $V_{T1}$ and $V_{T2}$ of the input-output characteristic is very high due to the negative resistance of the Esaki diode, high frequency response can be obtained in this embodiment.

The embodiment shown in FIG. 5 is suitable to realize a fail-safe logical circuit. If a resistance equal to the resistance of the transistor $TR_1$ or $TR_2$ in a case of no input signal is inserted in series at the collector of the transistor $TR_1$ and $TR_2$, the output voltage $V_i$ is always zero in a case of short or open of the emitter-collector path of each of the transistors $TR_1$ and $TR_2$. In another main fault where the sets of Esaki diodes $ED_1$ and $ED_2$ are short-circuited, the output voltage V becomes zero. To make the output voltage $V_o$ zero at the open-circuit of the Esaki diodes $ED_1$ and $ED_2$, two ternary logic circuits of this invention having a pair of common output terminals $J_o$ and E may be used.

In the above description, it is assumed that the nonlinear characteristic of the load resistance is a double N-shaped voltage-current characteristic. However, the ternary logic circuit of this invention can be also constructed by the use of a load resistance having a double S-shaped voltage-current characteristic.

What we claim is:

1. A ternary logic circuit comprising:

a first controllable resistance whose resistance increases as the value of the input voltage thereof increases;

a second controllable resistance connected in series to the first controllable resistance, the resistance of the second controllable resistance decreasing as the value of the input voltage thereof increases;

a DC source operatively connected to the series-connection of the first and second controllable resistances to apply a plus voltage to one of the first and second controllable resistances and to apply a minus voltage to the other of the first and second controllable resistances;

means for applying a common input voltage to the first and second controllable resistances; and a load resistance connected across the ground and a junction between the first controllable resistance and the second controllable resistance, the load resistance having a nonlinear current-voltage characteristic in which the terminal voltage of the load resistance assumes a low value until the current of the load resistance exceeds a plus or minus threshold level after starting from zero and assumes one of plus and minus substantially constant possible values each higher than the low value when the current of the load resistance exceeds the plus and minus threshold levels respectively;

whereby an output voltage developed across the load resistance is so controlled in accordance with the input voltage that the output voltage assumes substantially zero when the input voltage assumes a value included in a first voltage-range between a predetermined plus voltage and a predetermined minus voltage, that the output voltage assumes a substantially constant plus voltage when the input voltage assumes a value included in one of a second voltage range and a third voltage range excluded from the first voltage-range to plus side and minus side respectively, and that the output voltage assumes a substantially constant minus voltage when the input voltage assumes a value included in the other of said second voltage-range and said third voltage-range.

2. A ternary logic circuit according to claim 1, in which the first controllable resistance and the second controllable resistance are respectively a PNP transistor and a NPN transistor, respective emitter-collector paths of the transistors being connected in series, the input voltage being applied to both bases of the transistors.

3. A ternary logic circuit according to claim 2, in which the load resistance comprises two sets of Esaki diodes connected in series to each other in opposite directions, each of the sets of Esaki diodes comprising a plurality of Esaki diodes connected in series to one another in the same direction.